United States Patent
Gattere et al.

(10) Patent No.: US 11,277,112 B2
(45) Date of Patent: Mar. 15, 2022

(54) MICRO-ELECTRO-MECHANICAL DEVICE WITH REDUCED TEMPERATURE SENSITIVITY AND MANUFACTURING METHOD THEREOF

(71) Applicant: STMicroelectronics S.r.l., Agrate Brianza (IT)

(72) Inventors: Gabriele Gattere, Castronno (IT); Lorenzo Corso, Ruginello (IT); Alessandro Tocchio, Milan (IT); Carlo Valzasina, Gessate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 29 days.

(21) Appl. No.: 16/991,820

(22) Filed: Aug. 12, 2020

(65) Prior Publication Data
US 2020/0373904 A1 Nov. 26, 2020

Related U.S. Application Data

(62) Division of application No. 15/976,611, filed on May 10, 2018, now Pat. No. 10,771,042.

(30) Foreign Application Priority Data

May 25, 2017 (IT) .................. 102017000057094

(51) Int. Cl.
- H03H 9/02 (2006.01)
- H03H 9/24 (2006.01)
- H03H 3/007 (2006.01)

(52) U.S. Cl.
CPC ...... *H03H 9/02448* (2013.01); *H03H 3/0076* (2013.01); *H03H 9/02259* (2013.01); *H03H 9/02338* (2013.01); *H03H 9/2405* (2013.01); *H03H 9/2431* (2013.01); *H03H 9/2447* (2013.01); *H03H 2009/02322* (2013.01); *H03H 2009/02496* (2013.01)

(58) Field of Classification Search
CPC .. H03H 9/02; H03H 9/02244; H03H 9/02283; H03H 9/023338; H03H 9/24; H03H 9/2447; H03H 3/007
See application file for complete search history.

(56) References Cited

U.S. PATENT DOCUMENTS

| | | | |
|---|---|---|---|
| 7,071,793 | B2 | 7/2006 | Lutz et al. |
| 7,806,586 | B2 | 10/2010 | Melamud et al. |
| 7,824,098 | B2 | 11/2010 | Melamud et al. |
| 9,431,993 | B1 | 8/2016 | Hsu et al. |
| 2004/0207489 | A1 | 10/2004 | Lutz et al. |
| 2007/0296526 | A1 | 12/2007 | Lutz et al. |
| 2008/0204173 | A1 | 8/2008 | Melamud et al. |

(Continued)

OTHER PUBLICATIONS

Hopcroft, "Temperature-Stabilized Silicon Resonators for Frequency References," Dissertation, Stanford University, Sep. 2007, 253 pages.

(Continued)

*Primary Examiner* — Dean O Takaoka
(74) *Attorney, Agent, or Firm* — Seed Intellectual Property Law Group LLP

(57) ABSTRACT

A microelectromechanical device having a mobile structure including mobile arms formed from a composite material and having a fixed structure including fixed arms capacitively coupled to the mobile arms. The composite material includes core regions of insulating material and a silicon coating.

20 Claims, 6 Drawing Sheets

(56) References Cited

U.S. PATENT DOCUMENTS

| | | |
|---|---|---|
| 2008/0218295 A1 | 9/2008 | Lutz et al. |
| 2009/0140443 A1 | 6/2009 | Hohlfeld et al. |
| 2011/0127621 A1 | 6/2011 | Kimura et al. |
| 2012/0262026 A1 | 10/2012 | Lin et al. |
| 2014/0252509 A1 | 9/2014 | Merassi |
| 2014/0284603 A1 | 9/2014 | Su et al. |
| 2016/0169931 A1 | 6/2016 | Tocchio |
| 2017/0108530 A1 | 4/2017 | Tocchio et al. |
| 2018/0339898 A1 | 11/2018 | Gattere et al. |

OTHER PUBLICATIONS

Melamud et al., "Temperature-Insensitive Composite Micromechanical Resonators," *Journal of Microelectromechanical Systems* 18(6):1409-1419, Dec. 2009.

MICRO-ELECTRO-MECHANICAL DEVICE WITH REDUCED TEMPERATURE SENSITIVITY AND MANUFACTURING METHOD THEREOF

BACKGROUND

Technical Field

The present disclosure relates to a microelectromechanical device with reduced temperature sensitivity and to a manufacturing method thereof.

Description of the Related Art

As is known, frequency stability is a critical point for different types of microelectromechanical (MEMS) sensors and actuators, such as, for example, resonators, oscillators, accelerometers and gyroscopes. In fact, frequency stability for such MEMS devices is often related to the sensitivity of the device, and therefore the performance of same.

In particular, in new silicon-based MEMS oscillators it is desired to have a better frequency stability so that they exhibit characteristics comparable to those of established crystal oscillators.

In MEMS devices, the oscillation frequency depends on the Young's modulus according to the relation:

$$f_{MEMS} \propto \sqrt{E} \qquad (1)$$

where $F_{MEMS}$ is the oscillation frequency and E is Young's modulus.

In turn, Young's modulus depends on the temperature according to the equation:

$$E(T) = E_0 \cdot (1 + TCE_1 \Delta T + TCE_2 \cdot \Delta T^2) \qquad (2)$$

where $E_0$ is Young's modulus at $T_0 = 25°$ C., $TCE_1$ and $TCE_2$ ("Temperature Coefficient E", temperature coefficient of the Young's modulus) are a first and a second temperature coefficient, and $\Delta T$ is the considered temperature variation.

As temperature and, consequently, Young's modulus change, the oscillation frequency changes and this can be problematic because it may compromise the frequency stability of the device.

Known solutions to this problem include the use of highly doped single-crystal silicon (SCS) or an electronic compensation.

In particular, high doping levels allow changing the crystalline structure of the material since this causes the electronic bands to move, thus, changing the elastic properties of the material. However, this solution cannot be used if, for example, the structural layer is made of polysilicon.

The electronic compensation solution involves using adders that add a compensation component to the detection signal. However, in this case, there is a higher complexity of the circuit connected to the microelectromechanical device and a higher power consumption.

It is known from the article by Melamud et al., "Temperature-Insensitive Composite Micromechanical Resonators" (Journal of Microelectromechanical Systems, volume 18, number 6, December 2009) and from U.S. Pat. Nos. 7,824,098 and 7,806,586 that the dependency of frequency on temperature may be compensated by using a composite material, comprising a plurality of materials with different and opposite temperature coefficients, proposing a material comprising a silicon core and a silicon oxide coating.

This solution is schematically shown in FIG. 1, showing a cross section (in a plane XZ of a Cartesian coordinate system XYZ) of a body 1 that can be manufactured using semiconductor technology and comprises an inner region 2 of silicon, and an outer layer 3 of silicon oxide. Here, the outer layer 3 extends around the entire perimeter of the inner region 2 and is obtained by oxidizing the silicon inner region, once same has been defined.

This solution takes advantage of the fact that the outer layer 3, of silicon oxide, has a positive temperature coefficient that opposes the (negative) temperature coefficient of the inner region 2, of silicon. As a result, the frequency variations of the material forming the inner region 2 are compensated by the outer layer 3.

In the aforementioned article, the compensation capacity of the composite material in FIG. 1 is demonstrated in a MEMS device, shown in FIG. 2 and indicated using reference sign 10. In particular, the depicted MEMS device 10 is a flexural tuning-fork resonator that is closed at both ends (DEFT, "double-ended tuning fork").

The MEMS device 10 comprises a detection electrode 13 and two drive electrodes 11. The detection electrode 13 is electrically coupled to both of the drive electrodes 11.

The drive and detection electrodes 11, 13 are fixed and are, for example, rectangular when seen from above (parallel to the plane XY in the Cartesian coordinate system XYZ).

The drive and detection electrodes 11, 13 are capacitively coupled to a mobile structure 20, for example, of a hollow rectangular shape which and comprises two oscillation beams 16, 19 and two vertical arms 17, 18, arranged in opposing pairs and extending around the perimeter of the rectangular shape of the mobile structure 20.

The oscillation beams 16, 19 and the two vertical arms 17, 18 surround, at a distance, the detection electrode 13 around its perimeter. The oscillation beams 16, 19 are composite elements with the cross section shown in FIG. 1.

The structure 20 is carried by an anchor 15 via a connection element 12.

When in use, the drive electrodes 11 are biased by an alternating drive voltage $V_{AC}$, while the structure 20 is biased, via the anchor 15 and the connection element 12, by a direct bias voltage $V_{DC}$.

In this way, as a result of natural electrical forces, the oscillation beams 16, 19 vibrate along the direction Y at their oscillation frequency, and the distance between same and the detection electrode 13 varies periodically. The oscillation frequency of the oscillation beams 16, 19 is detected as a capacitive variation by the detection electrode 13.

This generates a corresponding output signal supplied to an external processing circuit (not shown) that is consequently able to determine the variation in the oscillation frequency as a function of temperature variation, on the basis of equations (1) and (2).

In this way, it is possible to detect the trend of the oscillation frequency as a function of the temperature variation.

For example, FIG. 3 shows the trend of the relative frequency variation $\Delta f/f_0 = (f-f_0)/f_0$ as a function of the temperature in the MEMS device 10, oriented in the crystallographic direction [110] for different values of a nominal flexural ratio, indicated by the reference sign r, defined according to equation (3):

$$r = \frac{m_{Si}}{m_{SiO_2}} \frac{f_{si}^2}{f_{SiO_2}^2} \qquad (3)$$

in which $m_{Si}$ is the mass of silicon, $m_{SiO2}$ is the mass of silicon oxide, $f_{Si}$ is the natural oscillation frequency of silicon and $f_{SiO2}$ is the natural oscillation frequency of silicon oxide.

In FIG. 3, the curve A refers to a MEMS device 10 made of pure silicon.

As can be seen, the presence of the silicon oxide outer layer 3 makes it possible to significantly reduce the temperature dependency and the achievable improvement depends on the nominal flexural ratio r.

Despite the optimum capacity of the composite material in FIG. 1 to compensate for the variation in frequency as a function of the temperature, the presence of an outer layer of silicon oxide may cause a number of problems.

In particular, such problems may relate to reliability issues, since the outer layer of silicon oxide may reduce the robustness of the device against impacts.

Furthermore, the geometric characteristics of structures made in this way (for example the distance between the electrodes 11, 13 in FIG. 2, or the dimensions of the springs in other devices) are modified in a non-uniform manner and are not always perfectly predictable as a result of the presence of the outer layer itself, which is obtained by thermal growth, adversely affecting the performance of the device. In particular, the variability of the distance between the electrodes can be expressed as the variance $\sigma_g$ given by (4):

$$\sigma_g = \sqrt{\sigma_t^2 + \sigma_{ox}^2} \quad (4)$$

in which $\sigma_t$ is the variance in the width of the lithographic trench between two adjacent silicon elements before the oxidation process and $\sigma_{ox}$ is the variance in the layer of silicon oxide resulting from the oxidation process.

Adding the layer of silicon oxide introduces a further variability term which reduces the performance of the device.

Furthermore, in the case of inertial devices such as accelerometers, the presence of the layer of silicon oxide increases the risk of stiction, impeding the correct operation of the device.

BRIEF SUMMARY

The present disclosure is intended to provide a microelectromechanical device and a related manufacturing method that address drawbacks in the prior art.

The present disclosure provides for a microelectromechanical device with reduced temperature sensitivity and a related manufacturing method.

BRIEF DESCRIPTION OF THE SEVERAL VIEWS OF THE DRAWINGS

The present disclosure is further described below with reference to preferred embodiments thereof, which are provided purely as non-limiting examples, and to the attached drawings, wherein.

DETAILED DESCRIPTION

Figure 1:
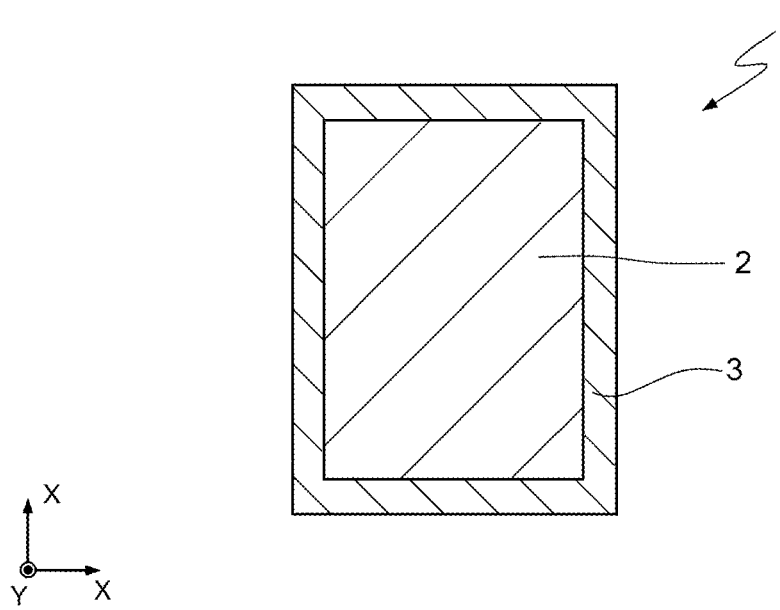
FIG. 1 shows a cross-section of a body of composite material of a known type.
Figure 2:
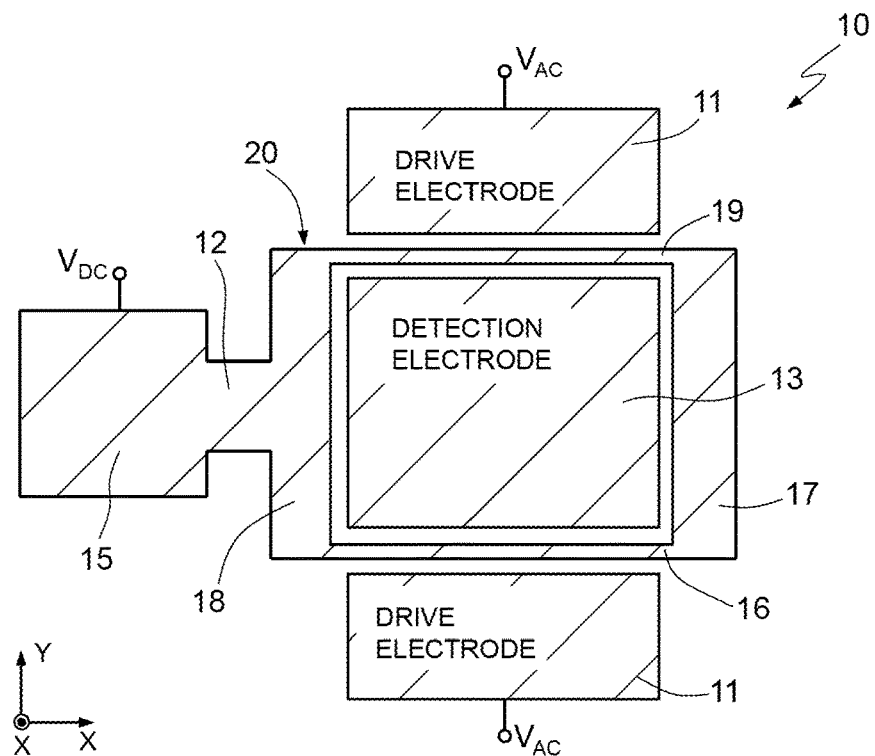
FIG. 2 shows a microelectromechanical device of a known type used to characterize the composite material in FIG. 1.
Figure 3:
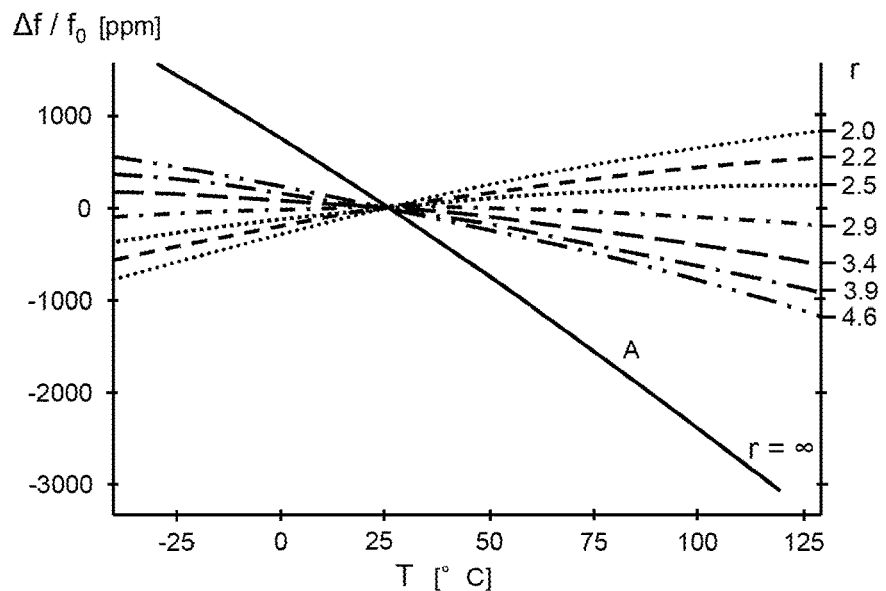
FIG. 3 shows the plot of a characteristic magnitude of the device in FIG. 2.
Figure 4:
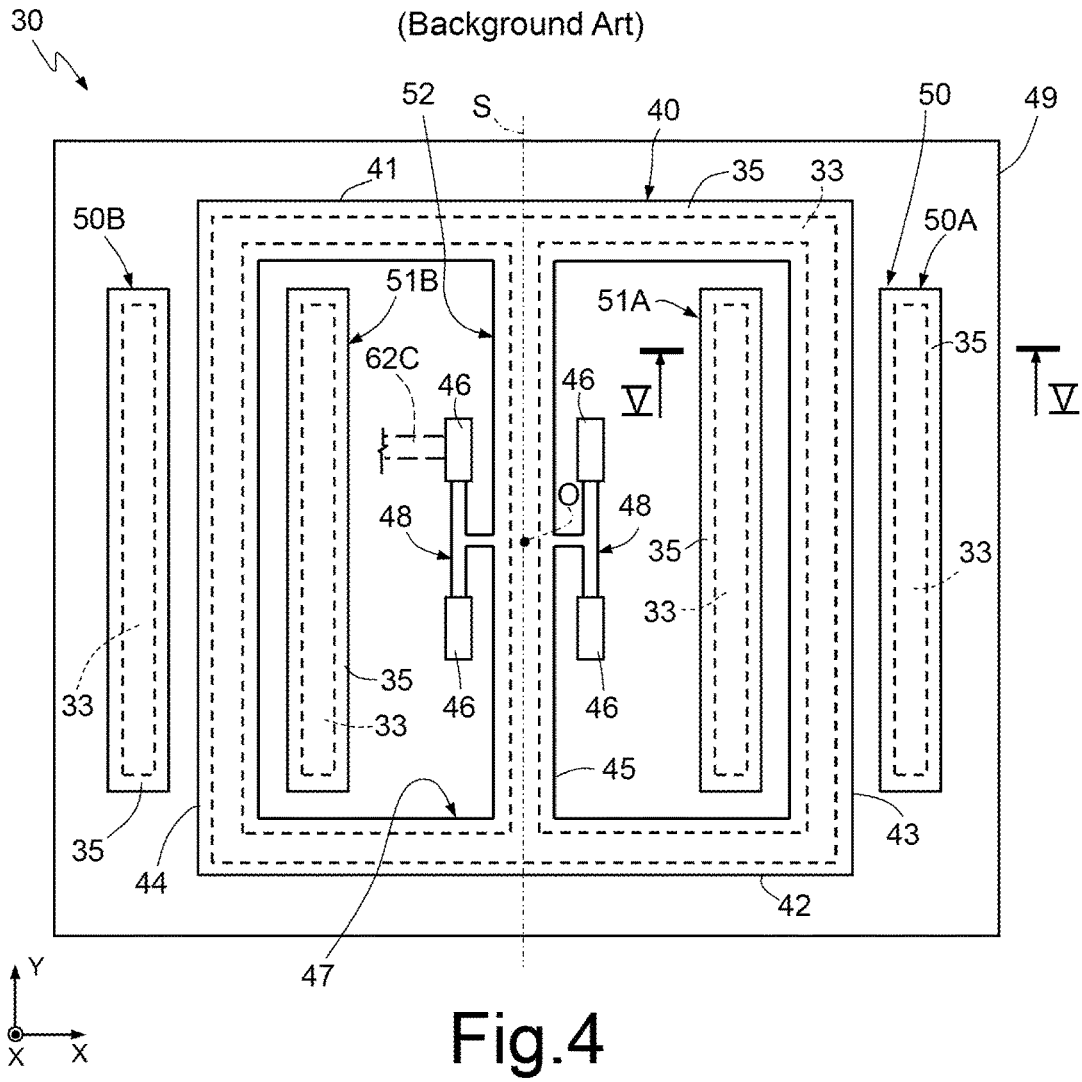
FIG. 4 is a simplified top view with ghost portions of a microelectromechanical device according to one embodiment of the present disclosure.

FIG. 4 shows a microelectromechanical device 30 (hereinafter also referred to as device 30). In particular, a MEMS device forming a microelectromechanical resonator is described below as an example. Nonetheless, the solution to which the present application relates applies to various types of MEMS devices, for example inertial devices such as accelerometers and gyroscopes. The disclosure described herein is therefore not limited to the specific device illustrated.

The device 30 comprises a mobile structure 40 and a fixed structure 50.

The mobile structure 40 is suspended above a supporting layer 49 (shown schematically in FIG. 4 and in greater detail in FIG. 5) of the device 30 and extends primarily in a horizontal plane XY of a Cartesian coordinate system XYZ.

The mobile structure 40 is made up of a first and a second flexing arm 43, 44 and by a first and a second transverse connecting element 41, 42. The flexing arms 43, 44 are parallel to one another and extend primarily lengthwise, in the example shown herein, parallel to a first horizontal axis Y of the Cartesian coordinate system XYZ.

The first and the second flexing arms 43, 44 are connected at a first end thereof by the first transverse connecting element 41, extending parallel to a second horizontal axis X, and at a second end thereof by the second transverse connecting element 42, which also extends parallel to the second horizontal axis X. In practice, the flexing arms 43, 44 and the transverse connecting elements 41, 42 extend along the sides of a quadrilateral, in this case a rectangle, and inwardly define a window 47 that is substantially rectangular in the horizontal plane XY.

The mobile structure 40 is suspended above the supporting layer 49 by a suspension structure 52 that includes a suspension arm 45. The latter is centrally arranged inside the window 47 and extends parallel to the first horizontal axis Y and to the first and second flexing arms 43, 44, from a central portion of the first transverse connecting element 41 to a corresponding central portion of the second transverse connecting element 42.

The suspension structure 52 also comprises herein a plurality of mobile anchors 46 arranged inside the window 47 and rigidly connected to the supporting layer 49. Furthermore, the suspension structure 52 comprises herein connection elements 48 that are also arranged inside the window 47, rigidly connecting the suspension arm 45 to the mobile anchors 46.

The mobile anchors 46 are, for example, pillar or column elements extending along a vertical axis Z of the reference system XYZ between the supporting layer 49 and the plane of the mobile structure 40 and of the fixed structure 50. Each connection element 48 is T-shaped and extends between the central portion of the suspension arm 45 and a respective pair of mobile anchors 46.

The fixed structure 50 is capacitively coupled to the mobile structure 40 in the horizontal plane XY and comprises a first and a second actuating electrode 50A, 50B and a first a second detection electrode 51A, 51B. The first and the second actuating electrodes 50A, 50B are arranged facing and parallel to the first and second flexing arms 43, 44, respectively, externally to the mobile structure 40 and the window 47. The first and the second detection electrodes 51A, 51B are arranged inside the window 47, facing and parallel to the first and second flexing arms 43, 44 respectively, internally to the same mobile structure 40.

In practice, as clearly shown in FIG. 4, the structure of the device 30 is symmetrical with respect to an axis of symmetry S passing through a barycenter 0 of the device 30.

Figure 5:
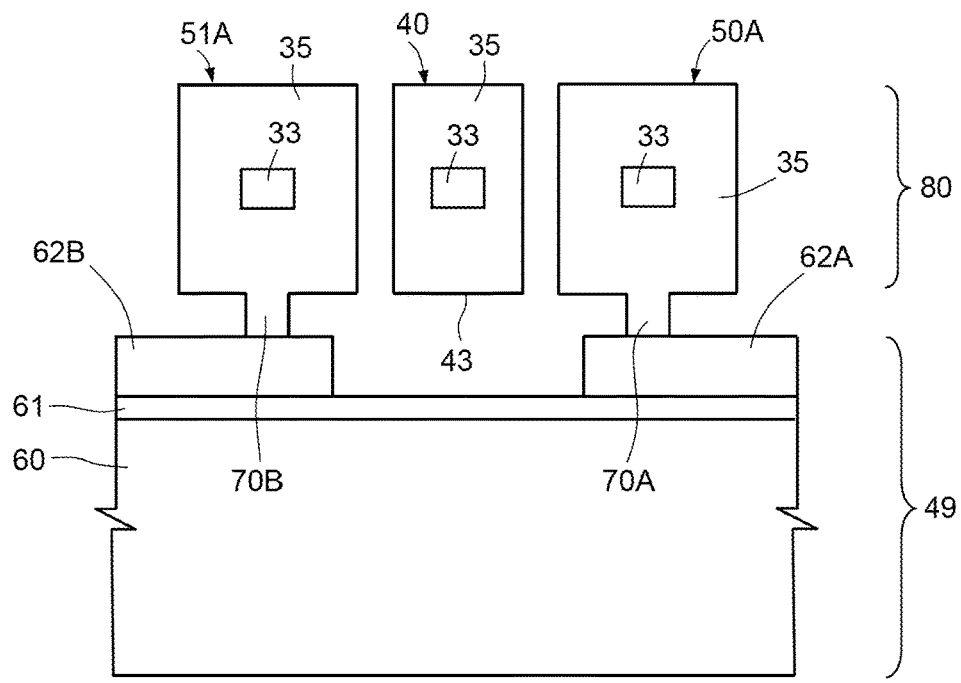
FIG. 5 is a cross-sectional view of the present device of FIG. 4 taken along a plane indicated by lines V-V in FIG. 4.

The actuating electrodes 50A, 50B and the detection electrodes 51A, 51B are anchored to the supporting layer 49 by means of respective fixed anchoring elements, for example shaped as columns or pillars, as shown in the cross section in FIG. 5. In this case, a first a second fixed anchoring element 70A, 70B extend from the supporting layer 49 and are electrically coupled to electrical connection lines 62A, 62B, made of polycrystalline silicon, extending above a substrate 60 and being electrically insulated from same by a first insulating layer 61. In detail, the first fixed anchoring element 70A extends between a respective actuating electrode 50A and a respective electrical connection line 62A and the second fixed anchoring element 70B extends between a respective detection electrode 51A and a respective electrical connection line 62B to bias the actuating electrodes 50A, 50B and the detection electrodes 51A, 51B. Similar electrical connection lines 62C (shown schematically using a dotted line in FIG. 4) extend across the substrate 49 and are electrically coupled to the mobile anchors 46 to bias the mobile structure 40.

In the embodiment described herein, the mobile structure 40, the suspension arm 45, the actuating electrodes 50A, 50B and the detection electrodes 51A, 51B are made of a composite material. In particular and as shown using the dotted line in FIG. 4 and in the cross section of a portion of the device 30 in FIG. 5, these are formed by a core region 33 made of an insulating material, for example silicon oxide, and by a silicon coating layer 35. In particular, the coating layer 35 completely surrounds the core region 33 so that the latter is not exposed at any point.

In the design phase, the dimensions of the core region 33 and of the coating layer 35 are studied in order to obtain the desirable electrical and mechanical characteristics for the device 30.

In particular, in the solution described herein, the dependency of the frequency on the temperature is minimized by adjusting the dimensional ratios between the thicknesses of the coating layer 35 and of the core region 33.

In fact, considering equation (2), it is possible to calculate a value of the thickness of the core region 35, defined here as $t_{ox}$, that minimizes the dependency of the frequency on the temperature in consideration of equation (5), as given in the text of Diana and Cheli, "Dinamica e vibrazione dei sistemi meccanici" ("Dynamics and vibration in mechanical systems", 2003, UTET Universita, 10th reprint, page 255) and applied herein to the flexing arms 43, 44:

$$f_r = \frac{\beta}{2\pi} \sqrt{\frac{\Sigma B_i}{m}} = \frac{\beta}{2\pi} \sqrt{\frac{\Sigma E_i(T) \cdot I_i}{\Sigma A_i \cdot \rho_i}} \quad (5)$$

in which $f_r$ is the resonant frequency of the device 30; $\beta$ is a constant of a mode of vibration obtained as reported in the aforementioned text by Diana and Cheli regarding transverse oscillation of beams; m is the mass of each flexing arm 43, 44; i refers to each material (silicon and oxide) of the composite layer 80; $B_i$ is a coefficient equal to the product of the Young's modulus $E_i$ and the moment of inertia $I_i$ of the section of each flexing arm 43, 44; $\rho_i$ is the density of each material; and $A_i$ is the section of each flexing arm 43, 44.

As is known, for the first mode of vibration, the moment of inertia $I_i$ is expressed as per (6):

$$I_i = \frac{1}{12} t_{ox} w_{ox}^3 \quad (6)$$

in which $t_{ox}$ and $w_{ox}$ are the thickness and the width of the core region 33, respectively.

Therefore, it is seen that, by varying the thickness $t_{ox}$ of the core region 33, it is possible to minimize the dependency of the resonant frequency $f_r$, and therefore of the oscillation frequency, on the temperature.

With reference to the coating layer 35, its thickness is studied during the design phase to ensure that the entire core region 33 is covered. For example, the thickness of the coating layer 35 may be greater than 2 μm, such as to enable certain process parameters to be taken into account, such as a possible misalignment of the masks (for example of 0.5 μm), a possible overetching during definition of the shape of the mobile structure 40 (for example of 1 μm) and the tolerance in the process phase (for example of 0.5 μm).

When in use, application of a suitable bias voltage between the actuating electrodes 50A, 50B and the mobile structure 40 causes a deforming antiphase movement, through bending, of the related first and second flexing arms 43, 44 in opposite directions along the second horizontal axis X, at the desired oscillation frequency.

The resulting movement of the first or second flexing arm 43, 44 towards or away from the first or second detection electrode 51A, 51B respectively causes a variation in the capacitive coupling between same and the generation of an associated electrical signal at the oscillation frequency, which may then be detected and processed or used by an electronic circuit (not shown herein) associated with the device 30.

The manufacturing phases of the device 30 in FIGS. 4 and 5 are shown in FIGS. 6 to 12.

Figure 6:
FIGS. 6 to 12 are cross-sectional views similar to FIG. 5 during successive manufacturing phases of the present device of FIG. 4 according to one embodiment of the present disclosure.

With reference to FIG. 6, the first insulating layer 61, which is for example made of silicon oxide, is thermally grown on the substrate 60, which is for example made of single-crystal silicon.

Figure 7:
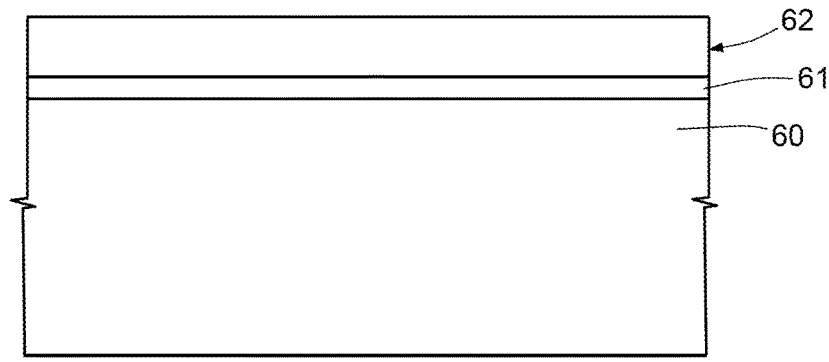

As shown in FIG. 7, a conductive layer 62, which is for example made of polycrystalline silicon, is deposited on the first insulating layer 61, for example using Low Pressure Chemical Vapor Deposition (LPCVD). The conductive layer 62 is then defined, for example by wet etching or using anisotropic etching techniques such as Deep Reactive Ion Etching (DRIE) in order to form the electrical connection lines 62A, 62B, 62C.

Figure 8:
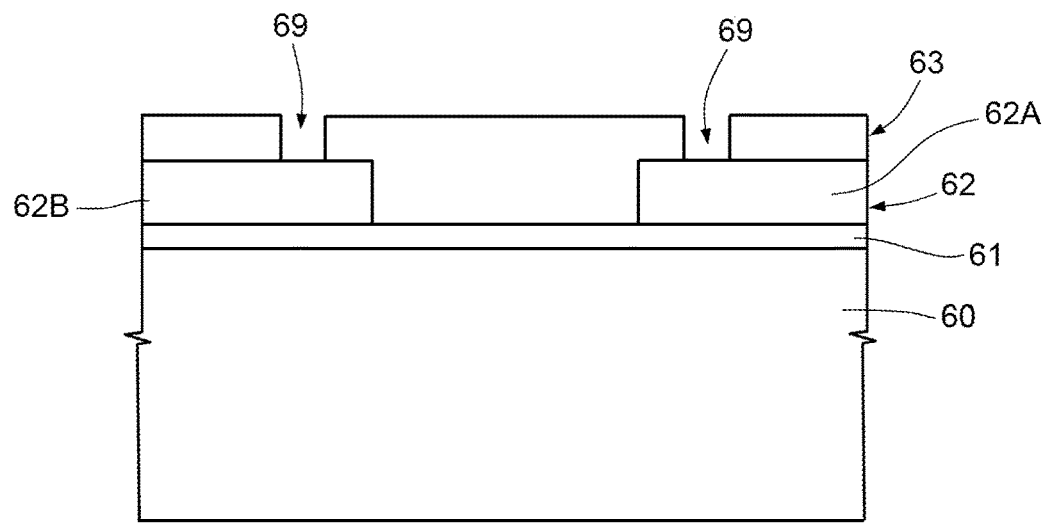

Subsequently, as shown in FIG. 8, a sacrificial layer 63 made of insulating material such as Tetra Ethyl Ortho Silicate (TEOS) is deposited using known techniques. The sacrificial layer 63 is then shaped using known photolithography techniques to remove the same at the anchoring zones of the overlying structures (in this case, the fixed anchors 70A, 70B), thus forming openings 69 above the electrical connection lines 62A, 62B, 62C.

Figure 9:
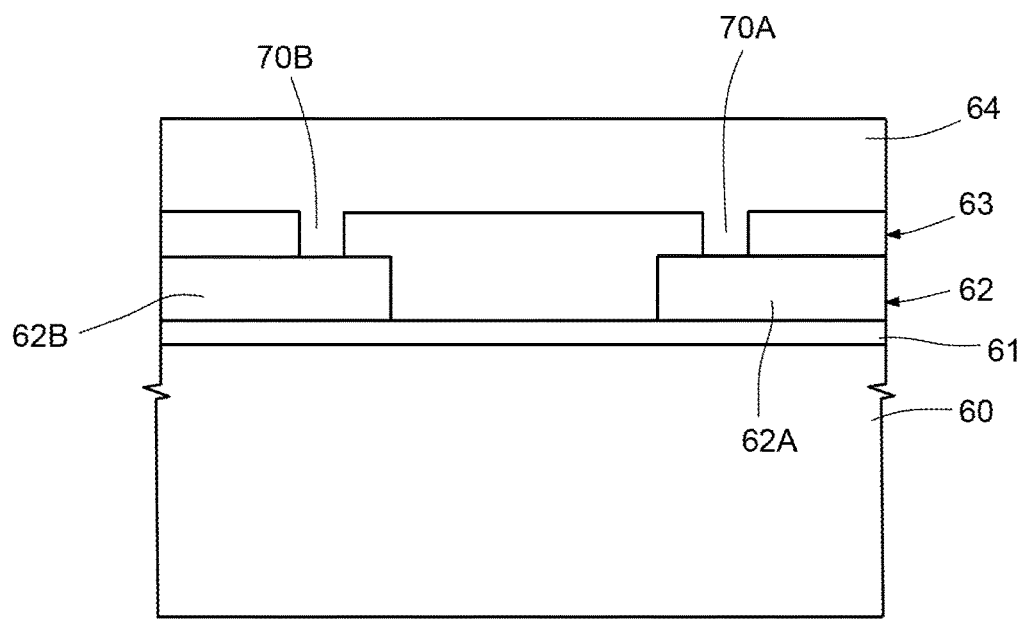

As shown in FIG. 9, a first epitaxial layer 64 of polycrystalline silicon is then grown on the sacrificial layer 63, extending over the entire surface of the sacrificial layer 63 and filling the openings 69. The fixed anchors 70A, 70B for the fixed structure 50 and the lower portions of the mobile anchors 46 of the mobile structure 40 and of the suspension arm 45 (not shown here) are thus formed. The thickness of the first epitaxial layer 64 may be, for example, of 3 µm.

The epitaxial layer 64 is then planarized using known techniques, such as Chemical Mechanical Polishing (CMP).

Figure 10:
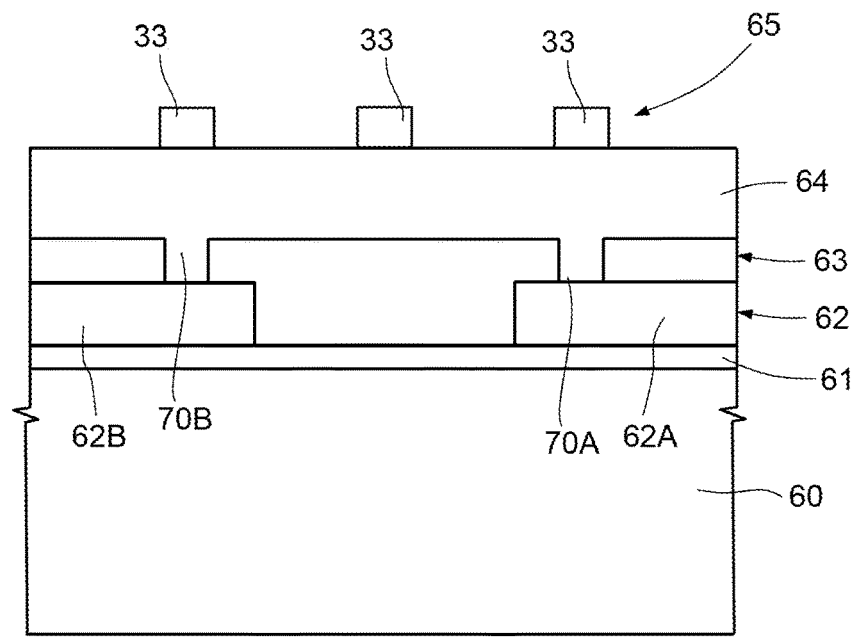

As shown in FIG. 10, a second insulating layer 65 of silicon oxide is uniformly deposited on the first epitaxial layer 64 and to a thickness, for example, of 4 µm. The second insulating layer 65 is then defined using known photolithography techniques, in order to form the core regions 33.

Figure 11:
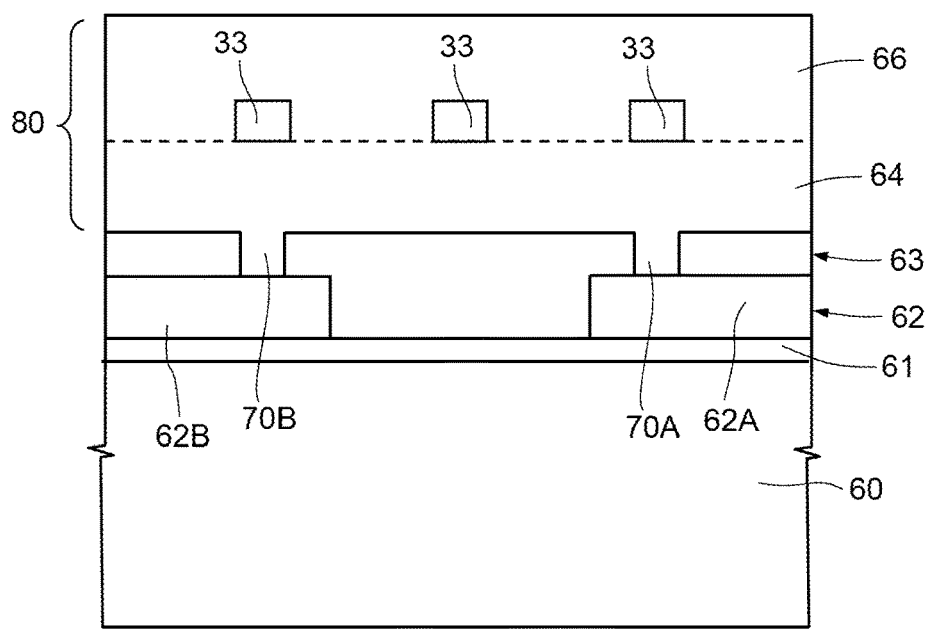

As shown in FIG. 11, a second epitaxial layer 66 of polycrystalline silicon is then grown. In practice, this results in forming a composite layer 80 made up of the first epitaxial layer 64 and the second epitaxial layer 66 (which are generally indistinguishable and shown separated by a dotted line only in FIG. 11, for demonstration purposes), with the core regions 33 embedded therein is formed.

The second epitaxial layer 66 is then planarized using known techniques, so that it has a thickness, for example, of 3 µm. Consequently, the total thickness of the composite layer 80 is for example 10 µm.

Figure 12:
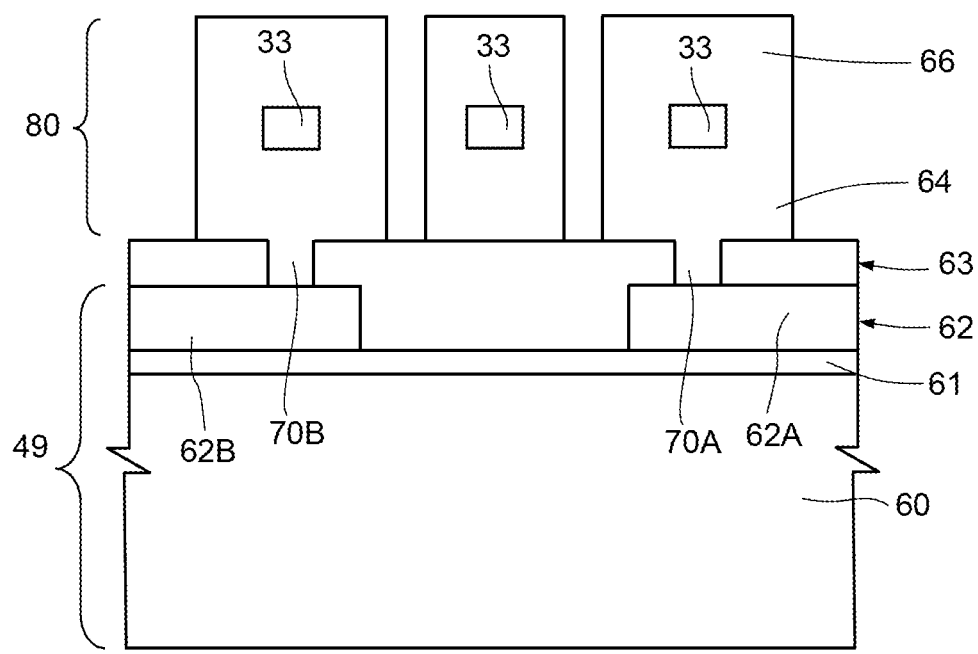

Subsequently, as shown in FIG. 12, the composite layer 80 is defined using anisotropic etching techniques, such as DRIE, forming the mobile structure 40, the suspension structure 52 and the fixed structure 50, of which FIG. 12 shows the actuating electrode 50A, the detection electrode 51A and the first flexing arm 42. The definition process is such that the etching does not uncover the silicon oxide core regions 33, which, as a result, are completely surrounded by the polycrystalline silicon of the epitaxial layers 64, 66.

Finally, the sacrificial layer 63 is removed, for example using known chemical etching techniques, thereby freeing the mobile structure 40 and the suspension structure 52 and obtaining the structure in FIG. 5.

After the final phases of manufacture, including the creation of metal connections, pads, etc., as known to the person skilled in the art, the wafer thus worked is cut to obtain a plurality of devices of the type of the device 30, as shown in FIGS. 4 and 5.

Figure 13:
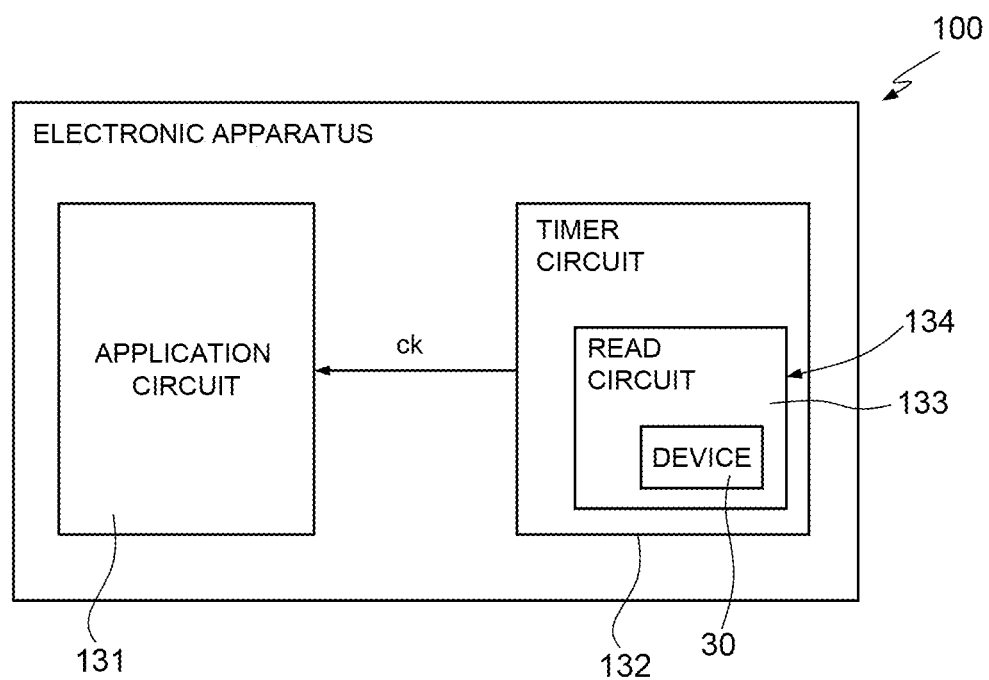
FIG. 13 is a block diagram of an electronic device incorporating the present microelectromechanical device of FIG. 4 according to another embodiment of the present disclosure.

The device 30, as indicated, is a resonator that can be incorporated into an electronic apparatus 100 (FIG. 13), that includes an application circuit 131, that is designed to execute one or more applications that require a timing from a clock signal ck, and a timing circuit 132 designed to provide the clock signal ck to the application circuit 131.

The timing circuit 132 includes the device 30, discussed above, and a related electronic reading circuit 133 that can advantageously be integrated into the device 30 in a single die 134 made of semiconductor material.

The advantages of the present disclosure are clear from the foregoing.

In particular, the ability to make microelectromechanical structures from a composite material formed by a core of silicon oxide and a coating of polycrystalline silicon, having opposite temperature coefficients, allows to obtain MEMS devices with an high stability in frequency as a function of the temperature.

The fact that the outer layer of the composite material is silicon and that this material constitutes most of the volume of the structures of the microelectromechanical device created ensures that the mechanical characteristics of said device, in particular reliability and shock resistance, are substantially the same as for pure silicon. Furthermore, given that the silicon layer is external, the MEMS device has high impact resistance, with no adverse effect on performance compared to devices made of composite material with a silicon core and a coating of insulating material.

Furthermore, since the geometric configuration of the structure is not modified after its photolithographic definition, the dimensional variability, and in particular the distance between the mobile and fixed elements, depends only on the tolerances of the definition process for the structures, there being no other contributing factors.

The fact that the silicon and silicon oxide portions are obtained by deposition and definition, instead of by definition and oxidation, allows improving the flexibility of the manufacturing method, for example in terms of thermal budget, thereby improving the reliability of the finished device.

Consequently, the present solution provides MEMS devices having very predictable, optimum frequency behavior.

It is evident that modifications and variations may be made to the device and method described and illustrated herein without thereby departing from the scope of the present disclosure, as defined in the attached claims.

For example, the composite material may be used for the mobile structure 40 only. In this case, the second insulating layer 65 is removed in the zone designed to form the suspension structure 52 and the fixed structure 50 during the definition process in FIG. 10.

The MEMS device 30, as indicated, may be of any type where frequency stability with temperature is desired, as, for example, in inertial devices such as accelerometers and gyroscopes, as well as in the described resonator.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising: forming a sacrificial layer on a substrate of semiconductor material; forming a first structural silicon layer on the sacrificial layer; forming core regions of insulating material on the first structural silicon layer; forming a second structural silicon layer on the core regions and the first structural silicon layer to completely surround the core regions with the first and second structural silicon layers; removing portions of the first and the second structural silicon layers to form mobile arms over the substrate, each of the mobile arms including a composite structure formed by portions of the first and the second structural silicon layers completely surrounding a corresponding one of the core regions; forming a suspension structure coupling the mobile arms to the substrate; forming a fixed structure on the substrate, a fixed structure including fixed arms capacitively coupled to the mobile arms; and at least partially removing the sacrificial layer.

2. The method according to claim 1, wherein forming the core regions and the first and second structural silicon layers comprises:

epitaxially growing the first structural silicon layer on the sacrificial layer, forming the core regions on top of the first structural silicon layer, epitaxially growing the second structural silicon layer on the first structural silicon layer and on the core regions.

3. The method according to claim 2, wherein forming the core regions comprises depositing a core layer on the first structural silicon layer and patterning the core layer to form the core regions.

4. The method according to claim 3, wherein forming the fixed structure on the substrate comprises forming the fixed structure to include some of the core regions.

5. The method according to claim 1, further comprising, before forming the sacrificial layer:

forming an insulating layer on the substrate; and
forming electrical connection lines on the first insulating layer.

6. The method according to claim 5, further comprising:

forming a suspension structure including the composite structure formed by portions of the first and the second structural silicon layers completely surrounding a corresponding one of the core regions, the suspension structure including a suspension arm that is coupled to the mobile arms;

forming from the first and second structural silicon layers a plurality of first anchoring elements;

forming from the first and second structural silicon layers connection elements interposed between the suspension arm and the plurality of first anchoring elements; and forming as part of the fixed structure a plurality of second anchoring elements coupled to the fixed arms.

7. The method of claim 6, wherein forming the plurality of first anchoring elements and forming the plurality of second anchoring elements comprises forming a plurality of openings in the sacrificial layer and growing the first structural silicon layer in the openings.

8. A method for manufacturing a microelectromechanical device including a mobile structure having mobile arms, and a fixed structure having fixed arms capacitively coupled to the mobile arms, the method comprising: forming a sacrificial layer on a semiconductor substrate; forming a composite material layer on the sacrificial layer, the composite material layer including a first structural silicon layer on the sacrificial layer, forming core regions of an insulating material on the first structural silicon layer, and a second structural silicon layer at least partially surrounding the core regions; forming the mobile arms by selectively removing portions of the first and the second structural silicon layer, the first and the second structural silicon layer completely surrounding the core regions in the mobile arms; and at least partially removing the sacrificial layer.

9. The method according to claim 8, wherein forming the composite material layer includes:

epitaxially growing the first structural silicon layer on the sacrificial layer, forming the core regions on the first structural silicon layer, and epitaxially growing the second structural silicon layer on the first structural silicon layer and on the core regions.

10. The method according to claim 9, wherein forming the core regions includes depositing a core layer on the first structural silicon layer and patterning the core layer to form the core regions.

11. The method according to claim 10, further comprising forming the fixed structure on the substrate, the fixed structure including the fixed arms capacitively coupled to the mobile arms.

12. The method according to claim 11, wherein the forming the fixed structure on the substrate includes forming the fixed structure to include some of the core regions.

13. The method according to claim 8, further comprising forming a suspension structure coupling the mobile arms to the substrate.

14. The method according to claim 8, further comprising, before forming the sacrificial layer:

forming an insulating layer on the substrate; and
forming electrical connection lines on the first insulating layer.

15. The method according to claim 14, further comprising:

forming a suspension structure including a suspension arm that is coupled to the mobile arms;

forming a plurality of first anchoring elements;

forming connection elements between the suspension arm and the plurality of first anchoring elements; and forming a plurality of second anchoring elements coupled to the fixed arms.

16. The method of claim 15, wherein the forming the plurality of first anchoring elements and the forming the plurality of second anchoring elements includes forming a plurality of openings in the sacrificial layer and growing the first structural silicon layer in the openings.

17. A microelectromechanical device, comprising:

a substrate;

a mobile structure coupled to the substrate, the mobile structure including:

a pair of flexible arms; and a pair of connecting elements coupled to the pair of flexible arms around a window;

a suspension arm coupled to each connecting element of the pair of connecting elements, at least one of flexible arm of the pair of flexible arms and the suspension arm have a composite structure including a core region including a first material and a coating layer on the core region including a second material different than the first material;

a plurality of anchors in the window;

a connection element in the window and coupled to two anchors of the plurality of anchors and the suspension arm;

a first detection electrode coupled to the substrate and positioned inside the window;

a first actuating electrode coupled to the substrate and positioned outside the window, wherein a first one of the flexible arms is capacitively coupled to the first actuating electrode and the first detection electrode;

a first electrical connection line on the substrate, the first actuating electrode overlying the first electrical connection line; and a first fixed anchoring element extending between the first electrical connection line and the first actuating electrode.

18. The microelectromechanical device according to claim 17, further comprising:

a second actuating electrode coupled to the substrate and positioned outside the window;

a second electrical connection line on the substrate, the second actuating electrode overlying the second electrical connection line; and a second fixed anchoring element extending between the second electrical connection line and the second actuating electrode.

19. The microelectromechanical device according to claim 18, wherein the first fixed anchoring element is configured to bias the first actuating electrode, and the second fixed anchoring element is configured to bias the second actuating electrode.

20. The microelectromechanical device according to claim 17, wherein the device is symmetrical with respect to an axis of symmetry extending along a length of the suspension arm.

* * * * *